United States Patent
Liu et al.

(10) Patent No.: US 11,139,347 B2
(45) Date of Patent: Oct. 5, 2021

(54) DISPLAY DEVICE AND METHOD FOR MANUFACTURING THE SAME

(71) Applicant: BOE Technology Group Co., Ltd., Beijing (CN)

(72) Inventors: Tun Liu, Beijing (CN); Huajie Yan, Beijing (CN); Zhiqiang Jiao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/599,708

(22) Filed: Oct. 11, 2019

(65) Prior Publication Data
US 2020/0227486 A1    Jul. 16, 2020

(30) Foreign Application Priority Data
Jan. 14, 2019   (CN) .......................... 201910032051.5

(51) Int. Cl.
| | |
|---|---|
| *H01L 27/32* | (2006.01) |
| *H01L 51/52* | (2006.01) |
| *H01L 51/56* | (2006.01) |
| *G02B 5/20* | (2006.01) |

(52) U.S. Cl.
CPC ........ *H01L 27/322* (2013.01); *H01L 27/3246* (2013.01); *H01L 51/5218* (2013.01); *H01L 51/5271* (2013.01); *H01L 51/56* (2013.01); *G02B 5/201* (2013.01)

(58) Field of Classification Search
CPC ............. H01L 27/14621; H01L 27/322; H01L 27/3246; H01L 33/60; H01L 51/5218; H01L 51/5271; H01L 51/56; G02B 5/201
See application file for complete search history.

(56) References Cited

U.S. PATENT DOCUMENTS

2018/0190748 A1*   7/2018   Im ...................... H01L 27/3248

FOREIGN PATENT DOCUMENTS

| CN | 102338900 A | 2/2012 |
|---|---|---|
| CN | 108231851 A | 6/2018 |
| JP | 2002365420 A | * 12/2002 |

OTHER PUBLICATIONS

Office Action of CN Application No. 201910032051.5 and translation, dated Apr. 26, 2020, 12 pages.

* cited by examiner

*Primary Examiner* — David C Spalla
(74) *Attorney, Agent, or Firm* — Muncy, Geissler, Olds and Lowe, P.C.

(57) ABSTRACT

A display device includes a display substrate and a color filter structure. The display substrate includes a base substrate and a plurality of light-emitting units on the base substrate. The color filter structure includes a shading unit and a plurality of spaced color filter units in the shading unit. The color filter units are corresponding to the light-emitting units in a one-to-one manner. The color filter structure further includes a plurality of light transmission compensation units that are corresponding to at least some of the color filter units in a one-to-one manner. The display device further includes a reflection unit located at a periphery of the corresponding light-emitting unit.

11 Claims, 4 Drawing Sheets

DISPLAY DEVICE AND METHOD FOR MANUFACTURING THE SAME

CROSS-REFERENCE TO RELATED APPLICATION

This application claims the benefit of Chinese Patent Application No. 201910032051.5, filed on Jan. 14, 2019, the disclosure of which is incorporated herein in its entirety by reference.

TECHNICAL FIELD

The present relates to the field of display technologies, and in particular to a display device and a method for manufacturing the same.

BACKGROUND

One organic light-emitting diode (OLED) display component has many advantages, such as self-luminescence, ultra-thin, fast reaction speed, high contrast, wide viewing angle, and has been widely concerned at present.

In the related art, one common OLED display component usually includes a red pixel unit, a green pixel unit, a blue pixel unit and a color filter substrate with three primary colors including red, green and blue. Although the OLED display component of such a structure has high color purity and color gamut, when the OLED display component is in a dark state, obvious color separation phenomenon may be seen when viewing a screen of the OLED display component from a lateral side of the OLED display component.

SUMMARY

One embodiment of the present disclosure provides a display device that includes a display substrate and a color filter structure. The display substrate includes a base substrate and a plurality of light-emitting units on the base substrate. The color filter structure includes a shading unit and a plurality of spaced color filter units in the shading unit. The color filter units are corresponding to the light-emitting units in a one-to-one manner. The color filter structure further includes a plurality of light transmission compensation units that are corresponding to at least some of the color filter units in a one-to-one manner. The display device further includes a reflection unit located at a periphery of the corresponding light-emitting unit.

Optionally, the compensation unit is located at a periphery of the corresponding color filter unit; and the compensation unit is spaced from the corresponding color filter unit.

Optionally, the display device further includes a pixel definition layer on the base substrate; the pixel definition layer defines a plurality of pixel opening regions on the base substrate; the plurality of light-emitting units are disposed in the plurality of pixel opening regions in a one-to-one manner; and the reflection unit is on a surface of the pixel definition layer distal to the base substrate.

Optionally, the compensation unit is in the shading unit and is located at a periphery of the corresponding color filter unit; the compensation unit is spaced from the corresponding color filter unit; an orthographic projection of the compensation unit to the base substrate is within an orthographic projection of the pixel definition layer to the base substrate.

Optionally, an orthographic projection of the reflection unit to the base substrate is located between an orthographic projection of the corresponding compensation unit to the base substrate and an orthographic projection of the corresponding color filter unit to the base substrate.

Optionally, there is no overlapping between the orthographic projection of the reflection unit to the base substrate and the orthographic projection of the corresponding compensation unit to the base substrate.

Optionally, the color filter unit and the corresponding compensation unit form as a combined filter unit; and an area of an orthographic projection of each combined filter unit to the base substrate is approximately the same.

Optionally, the color filter units include a red filter unit, a green filter unit and a blue filter unit; an area of the red filter unit is greater than an area of the green filter unit, and the area of the red filter unit is less than an area of the blue filter unit; the compensation units include a red compensation unit, a green compensation unit and a blue compensation unit; and an area of the red compensation unit is greater than an area of the blue compensation unit, and the area of the red compensation unit is less than an area of the green compensation unit.

Optionally, the red compensation unit includes a plurality of independent red compensation sub-units; the plurality of independent red compensation sub-units are distributed around a periphery of the red filter unit; the green compensation unit includes a plurality of independent green compensation sub-units; the plurality of independent green compensation sub-units are distributed around a periphery of the green filter unit; and the blue compensation unit includes a plurality of independent blue compensation sub-units; the plurality of independent blue compensation sub-units are distributed around a periphery of the blue filter unit.

Optionally, a quantity of the red compensation sub-units distributed around the periphery of the identical red filter unit, is greater than a quantity of the blue compensation sub-units distributed around the periphery of the identical blue filter unit; and the quantity of the red compensation sub-units distributed around the periphery of the identical red filter unit, is less than a quantity of the green compensation sub-units distributed around the periphery of the identical green filter unit.

Optionally, the light-emitting unit includes a cathode layer, a reflective anode layer disposed opposite to the cathode layer, and a light-emitting layer disposed between the anode layer and the cathode layer; the anode layer is disposed between the cathode layer and the base substrate; and the reflection unit and the anode layer in the corresponding light-emitting unit together form a combined reflection unit; an area of an orthographic projection of each combined reflection unit to the base substrate is approximately the same.

Optionally, the compensation unit and the corresponding color filter unit are in the same layer and made of the same material.

Optionally, each compensation unit includes a plurality of independent compensation sub-units; the plurality of independent compensation sub-units are distributed around a periphery of the corresponding color filter unit.

One embodiment of the present disclosure provides a method for a display device including: fabricating a display substrate and fabricating a color filter structure. The fabricating a display substrate includes: providing a base substrate; and fabricating a plurality of light-emitting units and reflection units on the base substrate. The fabricating the color filter structure includes: on one side of the plurality of light-emitting units distal to the base substrate, fabricating a light shading unit, a plurality of spaced color filter units that are in the light shading unit and corresponding to the plurality of light-emitting units in a one-to-one manner, and a plurality of light transmission compensation units that are corresponding to at least some of the color filter units in a one-to-one manner. The reflection units are corresponding to the compensation units in a one-to-one manner; the reflection unit is located at a periphery of the corresponding light-emitting unit; the reflection unit is configured to, when the display device is in a dark state, reflect ambient light rays that are incident from the corresponding compensation unit to the corresponding color filter unit, thereby enabling the ambient light rays to emit out from the display device through the color filter unit.

BRIEF DESCRIPTION OF THE DRAWINGS

In order to illustrate technical solutions according to embodiments of the present disclosure more clearly, drawings to be used in the description of the embodiments will be described briefly hereinafter. Apparently, the drawings described hereinafter are only some embodiments of the present disclosure, and other drawings may be obtained by those skilled in the art according to those drawings without creative work.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Figure 1:
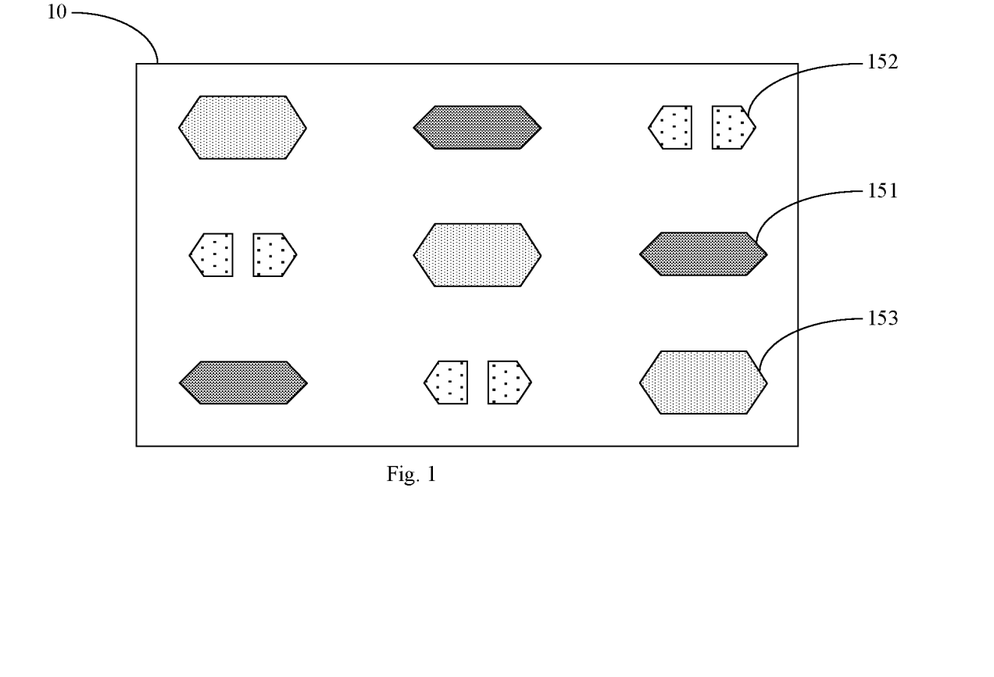
FIG. 1 is a schematic top view of a color filter unit of a display device in the related art.

Referring to FIG. 1, in the related art, when one OLED display component includes color pixel units and a color filter substrate with three primary colors including red, green and blue, the color pixel units include a red pixel unit, a green pixel unit and a blue pixel unit. The color filter substrate includes a red filter unit 151 corresponding to the red pixel unit, a green filter unit 152 corresponding to the green pixel unit, and a blue filter unit 153 corresponding to the blue pixel unit.

Due to the limitation of factors such as lifetime and brightness of different color pixel units, the blue pixel unit generally has a larger area, the green pixel unit generally has a smaller area, and an area of the red pixel unit is greater than the area of the green pixel unit but less than the area of the blue pixel unit.

In addition, each pixel unit includes an anode layer, a cathode layer disposed opposite to the anode layer and a light-emitting layer disposed between the anode layer and the cathode layer, and each pixel unit corresponds to a respective color filter unit, thus, an area of the anode layer corresponding to the blue pixel unit is greater than an area of the anode layer corresponding to the red pixel unit, and the area of the anode layer corresponding to the red pixel unit is greater than an area of the anode layer corresponding to the green pixel unit. Further, an area of the blue filter unit 153 corresponding to the blue pixel unit is greater than an area of the red filter unit 151 corresponding to the red pixel unit; and the area of the red filter unit 151 corresponding to the red pixel unit is greater than the area of the green filter unit 152 corresponding to the green pixel unit.

Figure 2:
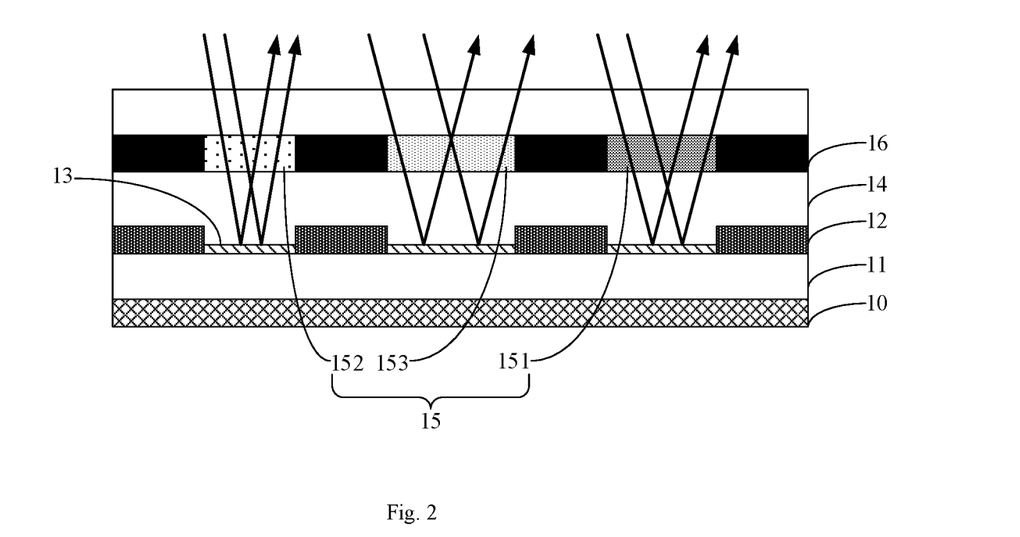
FIG. 2 is a schematic view of the display device in a dark state with reflected ambient light rays in the related art.
Figure 3:
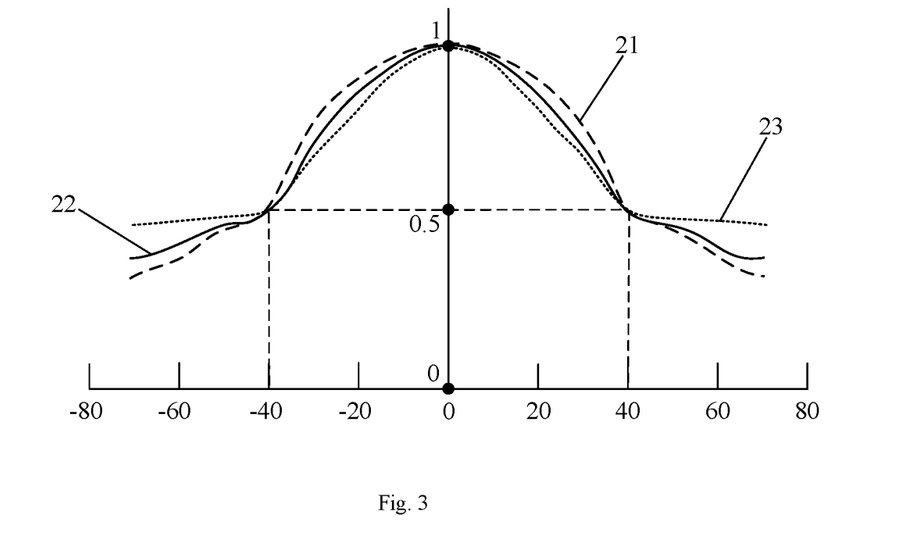
FIG. 3 is a schematic diagram showing attenuation degrees of different light rays when viewing the display device in the dark state from different viewing angles in the related art.

As shown in FIG. 2, when the OLED display component in a dark state, ambient light rays may be incident from each color filter unit 15 into the OLED display component, reflected by the anode layer 13 of each pixel unit in the OLED display component and emitted out from the OLED display component through each color filter unit 15. Since areas and shapes of anode layers 13 corresponding to the pixel units of different colors are different as well as areas and shapes of the color filter units 15 corresponding to the pixel units of different colors are different, there are difference in luminance attenuations of light rays emitted from the color filter units 15 of different colors when viewing from different viewing angles, specifically as shown in FIG. 3. In FIG. 3, the horizontal ordinate represents viewing angels (for example, the positive viewing angle is viewed from the right side of the display device, and the negative viewing angle is viewed from the left side of the display device), and the longitudinal ordinate represents the brightness attenuation ratio. The brightness attenuation ratio is a ratio of brightness of light rays of a certain color viewed at a non-zero viewing angle to the brightness of the light rays of the certain color viewed at zero viewing angle.

As can be seen from FIG. 3 that when the viewing angle is between positive 40 degrees and positive 80 degrees and when the viewing angle is between negative 40 degrees and negative 80 degrees, there are significant differences among the blue light attenuation curve 23 corresponding to blue light rays emitted through the blue filter unit 153, the red light attenuation curve 21 corresponding to red light rays emitted through the red filter unit 151, and the green light attenuation curve 22 corresponding to green light rays emitted through the green filter unit 152. Therefore, in the dark state, the white balance of the light rays reflected by the OLED display component is disturbed under different viewing angles. As a result, in the dark state, obvious color separation phenomenon may be seen when viewing a screen of the OLED display component from different viewing angles, thereby reducing user experience.

In view of this, inventors of the present disclosure have found that by compensating areas and shapes of the color filter units 15 and the corresponding anode layers 13, luminance attenuations of light rays emitted from the color filter units 15 of different colors when viewing from different viewing angles may be the same or similar, thereby solving the above problems.

Figure 4:
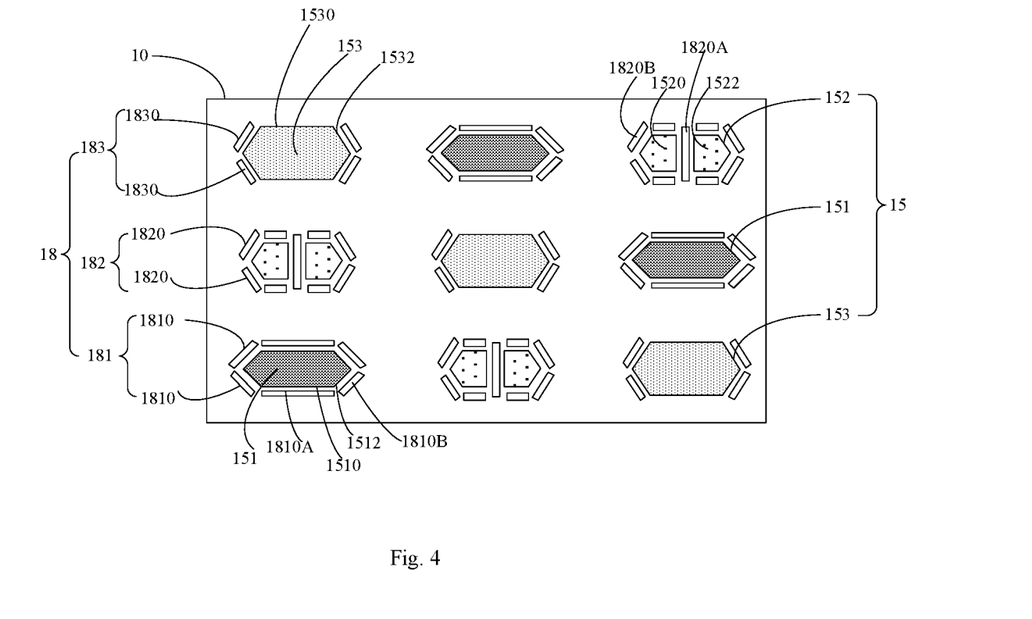
FIG. 4 is a schematic top view of a color filter unit and a compensation unit of a display device according to an embodiment of the present disclosure.
Figure 8:
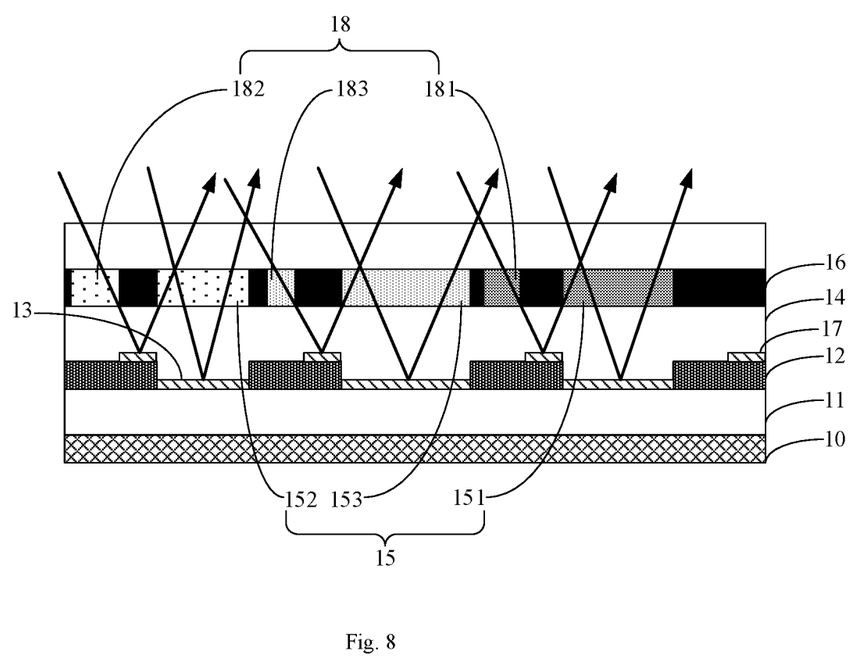
FIG. 8 is a schematic view of the display device in a dark state with reflected ambient light rays according to an embodiment of the present disclosure.

As shown in FIG. 4 and FIG. 8, one embodiment of the present disclosure provides a display device which includes a display substrate and a color filter structure. The display substrate includes a base substrate 10 and a plurality of light-emitting units on the base substrate 10. The color filter structure includes a shading unit 16 and a plurality of spaced color filter units 15. The color filter units 15 are corresponding to the light-emitting units in a one-to-one manner. The color filter structure further includes a plurality of light transmission compensation units 18. The light transmission compensation units 18 are corresponding to at least some of the color filter units 15 in a one-to-one manner. The display device further includes reflection units 17. The reflection units 17 are corresponding to the compensation units 18 in a one-to-one manner. The reflection unit 17 is located at a periphery of the corresponding light-emitting unit. When the display device is in a dark state, the reflection unit 17 is configured to reflect ambient light rays that are incident from the corresponding compensation unit 18 to the corresponding color filter unit 15, thereby enabling the ambient light rays to emit out from the display device through the color filter unit 15 and then enabling brightness of the ambient light rays emitted from the plurality of color filter units 15 to be uniformly attenuated.

Specifically, the above display substrate may include the base substrate, a thin film transistor array layer 11 on the base substrate 10, a plurality of reflection units 17 and a plurality of light-emitting units on one side of the thin film transistor array layer 11 distal to the base substrate 10. The reflection units 17 are corresponding to at least some of the light-emitting units in a one-to-one manner. The reflection unit 17 is located at a periphery of the corresponding light-emitting unit.

The above color filter structure may include the shading unit 16 and a plurality of spaced color filter units 15. The color filter units 15 are corresponding to the light-emitting units in a one-to-one manner. An orthographic projection of the color filter unit 15 to the base substrate 10 and an orthographic projection of the corresponding light-emitting unit to the base substrate 10 coincide with each other. For example, the color filter units 15 include a red filter unit 151, a green filter unit 152 and a blue filter unit 153. The light-emitting units include a red light-emitting unit, a green light-emitting unit and a blue light-emitting unit. An orthographic projection of the red filter unit 151 to the base substrate 10 and an orthographic projection of the corresponding red light-emitting unit to the base substrate 10 coincide with each other. An orthographic projection of the green filter unit 152 to the base substrate 10 and an orthographic projection of the corresponding green light-emitting unit to the base substrate 10 coincide with each other. An orthographic projection of the blue filter unit 153 to the base substrate 10 and an orthographic projection of the corresponding blue light-emitting unit to the base substrate 10 coincide with each other.

The above color filter structure further includes a plurality of light transmission compensation units 18. The light transmission compensation units 18 are corresponding to the reflection units 17 in a one-to-one manner.

Specific positions of the compensation unit 18 and the reflection unit 17 may be set according to actual needs, as long as when the display device is in the dark state the reflection unit 17 can reflect ambient light rays that are incident from the corresponding compensation unit 18 to the corresponding color filter unit 15, thereby enabling the ambient light rays to emit out from the display device through the color filter unit 15 and then enabling brightness of the ambient light rays emitted from the plurality of color filter units 15 to be uniformly attenuated.

When the above display device is in a display state, the thin film transistor array layer 11 drives the light-emitting units to emit light rays. The light rays emitted from the light-emitting units pass through the corresponding color filter units 15 and then are emitted out from the display device, thereby realizing display function of the display device. When the above display device is in a dark state (i.e., non-display state), ambient light rays may be incident from each color filter unit 15 into the display device, reflected by the anode layer 13 of the light-emitting unit corresponding to each color filter unit 15 and then emitted out from the display device through each color filter unit 15. Meanwhile, ambient light rays may be incident from the compensation units 18 into the display device, reflected by the reflection unit 17 corresponding to each compensation unit 18 and then emitted out from the display device through the color filter unit 15 corresponding to each compensation unit 18.

As can be seen from the specific structure of the above display device and reflection of light rays in the dark state, in the display device provided in one embodiment of the present disclosure, the light transmission compensation units 18 are corresponding to the reflection units 17 in a one-to-one manner, and the light transmission compensation units 18 are provided in the color filter structure and are corresponding to at least some of the color filter units 15 in a one-to-one manner, the reflection unit 17 is located at a periphery of the corresponding light-emitting unit. In this way, when the display device is in the dark state, ambient light rays may be incident from the color filter units 15 into the display device, reflected by the anode layer 13 of the light-emitting unit corresponding to each color filter unit 15 and then emitted out from the display device through each color filter unit 15. Meanwhile, ambient light rays may be incident from the compensation units 18 into the display device, reflected by the reflection unit 17 corresponding to each compensation unit 18 and then emitted out from the display device through the color filter unit 15 corresponding to each compensation unit 18. As a result, brightness of the ambient light rays that emit out from the display device through the color filter unit 15, may be uniformly attenuated. Therefore, when the display device provided in one embodiment of the present disclosure is in the dark state, luminance attenuations of light rays emitted from the color filter units 15 of different colors when viewing from different viewing angles may be the same or similar. Thus, in the dark state, the white balance of the light rays reflected by the display device is not disturbed under different viewing angles. As a result, in the dark state, obvious color separation phenomenon cannot be seen, thereby improving effectively user's experience.

The compensation units 18 provided in the above embodiment may be disposed at a variety of positions. For example, the compensation unit 18 may be disposed at a periphery of the corresponding color filter unit 15, and the compensation unit 18 is spaced apart from the corresponding color filter unit 15.

In one embodiment, as shown in FIG. 4, the color filter units 15 include a red filter unit 151, a green filter unit 152 and a blue filter unit 153. An area of the red filter unit 151 is greater than an area of the green filter unit 152, and the area of the red filter unit 151 is less than an area of the blue filter unit 153. The compensation units 18 include a red compensation unit 181, a green compensation unit 182 and a blue compensation unit 183. An area of the red compensation unit 181 is greater than an area of the blue compensation unit 183, and the area of the red compensation unit 181 is less than an area of the green compensation unit 182.

The red compensation unit 181 includes a plurality of independent red compensation sub-units 1810. The red compensation sub-units 1810 are uniformly distributed around a periphery of the red filter unit 151. The green compensation unit 182 includes a plurality of independent green compensation sub-units 1820. The green compensation sub-units 1820 are uniformly distributed around a periphery of the green filter unit 152. The blue compensation unit 183 includes a plurality of independent blue compensation sub-units 1830. The blue compensation sub-units 1830 are uniformly distributed around a periphery of the blue filter unit 153. A quantity of the red compensation sub-units 1810 around the identical red filter unit 151 is greater than a quantity of the blue compensation sub-units 1830 around the identical blue filter unit 153. The quantity of the red compensation sub-units 1810 around the identical red filter unit 151 is less than a quantity of the green compensation sub-units 1820 around the identical green filter unit 152.

In the embodiment shown in FIG. 4, the red filter unit 151 is substantially a hexagon and includes two oppositely disposed first long sides 1510 and four second short sides 1512 between the two first long sides 1510. There are six red compensation sub-units 1810 disposed around a periphery of the identical red filter unit 151. The six red compensation sub-units 1810 include two red compensation sub-units 1810A of a first length and four red compensation sub-units 1810B of a second length. The two red compensation sub-units 1810A of the first length are adjacent and parallel with the first long sides 1510, respectively. The four red compensation sub-units 1810B of the second length are adjacent and parallel with the short sides 1512, respectively.

The green filter unit 152 includes a first sub-portion 1520 and a second sub-portion 1522 that is spaced apart from the first sub-portion 1520. Each of the first sub-portion 1520 and the second sub-portion 1522 is substantially a pentagon. There are nine green compensation sub-units 1820 disposed around the green filter unit 152. The nine green compensation sub-units 1820 include a first green compensation sub-unit 1820A disposed between the first sub-portion 1520 and the second sub-portion 1522, and several second green compensation sub-units 1820B disposed around the first sub-portion 1520 and the second sub-portion 1522. For example, there are eight second green compensation sub-units 1820B disposed around the first sub-portion 1520 and the second sub-portion 1522. A sum of areas of the nine green compensation sub-units 1820 is greater than a sum of areas of the six red compensation sub-units 1810.

The blue filter unit 153 is substantially a hexagon and includes two oppositely disposed first long sides 1530 and four second short sides 1532 between the two first long sides 1530. There are four blue compensation sub-units 1830 disposed around a periphery of the identical blue filter unit 153. The four blue compensation sub-units 1830 are adjacent and parallel with the four second short sides 1532, respectively. A sum of areas of the four blue compensation sub-units 1830 is less than the sum of areas of the six red compensation sub-units 1810.

In one embodiment, a sum of areas of one red filter unit 151 and the red compensation sub-units 1810 around the one red filter unit 151, is substantially equal to a sum of areas of one green filter unit 152 and the green compensation sub-units 1820 around the one green filter unit 152. The sum of areas of one red filter unit 151 and the red compensation sub-units 1810 around the one red filter unit 151, is also substantially equal to a sum of areas of one blue filter unit 153 and the blue compensation sub-units 1830 around the one blue filter unit 153. In this way, each compensation unit 18 can adaptively compensate light intensity of outgoing light rays of the corresponding color filter unit 15 in the dark state, so that in the dark state, the light intensity of the light rays emitted from each color filter unit 15 is the same or similar. As a result, when viewing the display device in the dark state, even if the viewing angles are different, luminance attenuations of light rays emitted from the color filter units 15 of different colors may be the same or similar, so that the white balance of the light rays reflected by the display device is not be disturbed under different viewing angles, and then obvious color separation phenomenon cannot be seen, thereby improving effectively user's experience.

Specifically, the compensation unit 18 may be disposed at a periphery of the corresponding color filter unit 15, and the compensation unit 18 is spaced apart from the corresponding color filter unit 15, and the shading unit 16 is disposed in other regions of the color filter structure other than regions where the color filter units 15 and the compensation units 18 are located. This enables the shading unit 16 to be distributed between each compensation unit 18 and each color filter unit 15. Thus, when the display device realizes display function, light rays emitted from each pixel unit still pass through only the corresponding color filter unit 15 and then emit from the display device, and will not pass through the compensation unit 18 and then emit from the display device. As a result, normal display effect of the display device in the display state can be ensured, and the normal display effect of the display device in the display state will not be affected by the added compensation units 18.

In some embodiments, the display device provided in the above embodiment further includes a pixel definition layer 12 on the base substrate 10. The pixel definition layer 12 defines a plurality of pixel opening regions on the base substrate 10. The light-emitting units are disposed in the pixel opening regions in a one-to-one manner. The reflection units 17 are on a surface of the pixel definition layer 12 distal to the base substrate 10.

Specifically, in order to avoid occurrence of mixed color phenomenon, after formation of the thin film transistor array layer 11 on the base substrate 10, the pixel definition layer 12 is first formed on one side of the thin film transistor array layer 11 distal to the base substrate 10, thereby defining a plurality of pixel opening regions by the pixel definition layer 12, and then the light-emitting units are formed in the plurality of pixel opening regions. The pixel definition layer 12 mainly includes a barrier-wall pattern, that is, the barrier-wall pattern defines the pixel opening regions. Since a surface of the barrier-wall pattern distal to the base substrate 10 is a flat surface and the barrier-wall pattern is located at peripheries of the light-emitting units, the presence of the reflection units 17 on the surface of the pixel definition layer 12 distal to the base substrate 10 can ensure normal reflection function of the reflection units 17 while not affecting normal display of the display device.

It should be noted that methods for fabricating the reflection units in the above embodiment are various. In some embodiments, after formation of the pixel definition layer 12 and the anode layers 13 of the light-emitting units, a reflective layer film made of Al material is formed on one side of the pixel definition layer 12 distal to the base substrate 10. Then, the reflective layer film is patterned, thereby forming the reflection units 17 on the surface of the pixel definition layer 12 distal to the base substrate 10. It should be noted that the above-mentioned patterning process includes exposing, developing, etching and other general processes, which are nor elaborated herein.

Further, specific positions and sizes of the above-mentioned reflection units 17 are various. For example, an orthographic projection of the reflection unit 17 to the base substrate 10 is located between an orthographic projection of the corresponding compensation unit 18 to the base substrate 10 and an orthographic projection of the corresponding color filter unit 15 to the base substrate 10.

Specifically, when the orthographic projection of the reflection unit 17 to the base substrate 10 is located between the orthographic projection of the corresponding compensation unit 18 to the base substrate 10 and the orthographic projection of the corresponding color filter unit 15 to the base substrate 10, the reflection unit 17 is enabled to better reflect light rays that are incident from the corresponding compensation unit 18 to the corresponding color filter unit 15, thereby enabling the light rays to emit out from the display device through the color filter unit 15.

It should be noted that setting the orthographic projection of the reflection unit 17 to the base substrate 10 to be located between the orthographic projection of the corresponding compensation unit 18 to the base substrate 10 and the orthographic projection of the corresponding color filter unit 15 to the base substrate 10, includes two situations. One situation is that the orthographic projection of the reflection unit 17 to the base substrate 10 overlaps with the orthographic projection of the corresponding compensation unit 18 to the base substrate 10. Another situation is that the orthographic projection of the reflection unit 17 to the base substrate 10 does not overlap with the orthographic projection of the corresponding compensation unit 18 to the base substrate 10.

Optionally, in some embodiments, the orthographic projection of the reflection unit 17 to the base substrate 10 does not overlap with the orthographic projection of the corresponding compensation unit 18 to the base substrate 10.

Specifically, when the orthographic projection of the reflection unit 17 to the base substrate 10 does not overlap with the orthographic projection of the corresponding compensation unit 18 to the base substrate 10, the reflection unit 17 is enabled to reflect only ambient light rays with an incident angle of being greater than 0 degrees to the corresponding color filter unit 15, without ambient light rays with an incident angle of being equal to 0 degrees being reflected and then emitting out of the display device through the corresponding compensation unit 18 at an exit angle of 0 degrees. This can prevent the white balance of the light rays reflected by the display device from being affected by the presence of the compensation unit 18 and the reflection unit 17. It should be noted that the incident angle herein refers to an angle between light rays incident on the display device and the vertical direction when the display device is in the position shown in FIG. 8.

Referring to FIG. 4, in some embodiments, the color filter unit 15 and the corresponding compensation unit 18 in the above embodiment can form as a combined filter unit. Areas of orthographic projections of various combined filter units included in the display device to the base substrate 10 are approximately the same. For example, in some embodiments, ratios of the areas of the orthographic projections of the various combined filter units to the base substrate 10 may be in the range of 90 to 110%, as long as the human eyes cannot recognize.

Specifically, as an example, each color filter unit 15 in the display device is corresponding to one compensation unit 18, each color filter unit 15 and the corresponding compensation unit 18 form as a combined filter unit, and areas of orthographic projections of various combined filter units included in the display device to the base substrate 10 are approximately the same. In this way, each compensation unit 18 can adaptively compensate light intensity of outgoing light rays of the corresponding color filter unit 15 in the dark state, so that in the dark state, the light intensity of the light rays emitted from each color filter unit 15 is the same or similar. As a result, when viewing the display device in the dark state, even if the viewing angles are different, luminance attenuations of light rays emitted from the color filter units 15 of different colors may be the same or similar, so that the white balance of the light rays reflected by the display device is not be disturbed under different viewing angles, and then obvious color separation phenomenon cannot be seen, thereby improving effectively user's experience.

Further, contour profiles of orthographic projections of various combined filter units to the base substrate may be set to be the same or similar.

Specifically, when the contour profiles of the orthographic projections of various combined filter units to the base substrate are set to be the same or similar, each compensation unit 18 can adaptively compensate light intensity of outgoing light rays of the corresponding color filter unit 15 in the dark state, so that in the dark state, the light intensity of the light rays emitted from each color filter unit 15 is the same or similar.

Further, each compensation unit 18 may specifically include a plurality of separate sub-compensation units. The plurality of separately sub-compensation units are distributed around a periphery of the corresponding color filter unit 15.

Specifically, the above compensation unit 18 may specifically include one sub-compensation unit and/or a plurality of separate sub-compensation units. When the compensation unit 18 includes a plurality of separate sub-compensation units, the plurality of separate sub-compensation units may be uniformly distributed around the periphery of the corresponding color filter unit 15. This is not only conducive to compensating the light intensity of outgoing light rays of the corresponding color filter unit 15 in multiple directions, but also conducive to formation of the combined filter units with the same contour shape.

In some embodiments, the above compensation unit 18 and the corresponding color filter unit 15 may be in the same layer and made of the same material.

When the compensation unit 18 and the corresponding color filter unit 15 are in the same layer and made of the same material, the compensation unit 18 and the corresponding color filter unit 15 can be fabricated simultaneously through only one film forming process, without adding an additional process for fabricating the compensation unit 18.

As an example, one process for fabricating the green filter unit 152 and the compensation unit 18 corresponding to the green filter unit 152 includes: forming a green film layer on a base by using green filter material; exposing the green film layer with a mask plate, thereby forming a film reserved region and a film removal region, where the film reserved region is corresponding to regions in which the green filter unit 152 and the compensation unit 18 are located, and the film removal region is corresponding to other regions except for the regions in which the green filter unit 152 and the compensation unit 18 are located; then, developing the exposed green film layer with a developer to remove the green film layer in the film removal region, thereby forming the green filter unit 152 and the corresponding compensation unit 18.

As shown in FIG. 8, in some embodiments, the above color filter unit 15 includes a red filter unit 151, a green filter unit 152 and a blue filter unit 153. An area of the red filter unit 151 is greater than an area of the green filter unit 152, and the area of the red filter unit 151 is less than an area of the blue filter unit 153. The compensation unit 18 includes a red compensation unit 181, a green compensation unit 182 and a blue compensation unit 183. An area of the red compensation unit 181 is greater than an area of the blue compensation unit 183, and the area of the red compensation unit 181 is less than an area of the green compensation unit 182.

Specifically, due to limitation of service life of materials selected for the light-emitting layer in the light-emitting unit, when fabricating the light-emitting unit, the area of the red light-emitting unit is greater than the area of the green light-emitting unit, and the area of the red light-emitting unit is less than the rea of the blue light-emitting unit. Moreover, since the color filter units 15 are corresponding to the light-emitting units in a one-to-one manner as well as the orthographic projection of the color filter unit 15 to the base substrate 10 and the orthographic projection of the corresponding light-emitting unit to the base substrate 10 coincide with each other, it is necessary to set the area of the red filter unit 151 to be greater than the area of the green filter unit 152, and the area of the red filter unit 151 to be less than that of the blue filter unit 153.

Since the area of the red filter unit 151 is greater than the area of the green filter unit 152, and the area of the red filter unit 151 is less than that of the blue filter unit 153, in dark state, the light intensity of the red light rays emitted from the red filter unit 151 is stronger than the light intensity of the green light rays emitted from the green filter unit 152, and the light intensity of the red light rays is less than the light intensity of the blue light rays emitted from the blue filter unit 153. Therefore, when the compensation unit 18 is provided, the area of the red compensation unit 181 may be greater than the area of the blue compensation unit 183, and the area of the red compensation unit 181 may be less than the area of the green compensation unit 182, so that the areas of orthographic projections of various combined filter units to the base substrate are the same. As a result, in dark state, the light intensity of the light rays emitted from each color filter unit 15 is the same or similar, which ensures that the white balance of the light rays reflected by the display device is not be disturbed under different viewing angles and then obvious color separation phenomenon cannot be seen.

In some embodiments, the above light-emitting unit includes a cathode layer, a reflective anode layer 13 disposed opposite to the cathode layer, and a light-emitting layer disposed between the anode layer 13 and the cathode layer. The anode layer 13 is disposed between the cathode layer and the base substrate 10. The reflection unit 17 and the anode layer 13 in the corresponding light-emitting unit together form a combined reflection unit. Areas of orthographic projections of various combined reflection units included in the display device to the base substrate 10 are the same.

Specifically, the above light-emitting unit generally includes an anode layer 13, a light-emitting layer and a cathode layer which are stacked in sequence. Comparing with the light-emitting layer and the cathode layer, the anode layer 13 is closest to the base substrate 10 and may be coupled with driver transistors of the thin film transistor array layer 11 located on the base substrate 10. When the display device is in the display state, the anode layer 13 receives a driving signal provided by the drive transistor, and the cathode layer receives a cathode signal provided by a driving chip in the display device, and then a driving electric field is generated between the anode layer 13 and the cathode layer. The driving electric field drives the corresponding light-emitting layer to emit light. When the display device is in dark state, since the anode layer 13 has reflective effect, the anode layer 13 can reflect ambient light rays that enters the corresponding color filter units 15 in dark state, thereby enabling the ambient light rays to be emitted out of the display device through the corresponding color filter units 15.

For an example, each color filter unit 15 in the display device is corresponding to one compensation unit 18, and each light-emitting unit is corresponding to one reflection unit 17, the reflection unit 17 and the anode layer 13 in the corresponding light-emitting unit together form a combined reflection unit. Areas of orthographic projections of various combined reflection units included in the display device to the base substrate 10 are the same, so that each reflection unit 17 can reflect the ambient light rays that are incident through the corresponding compensation unit 18 to the corresponding color filter unit 15, and then the reflected ambient light rays can be emitted out of the display device through the color filter unit 15. Thus, each compensation unit 18 can adaptively compensate light intensity of outgoing light rays of the corresponding color filter unit 15 in the dark state, so that in the dark state, the light intensity of the light rays emitted from each color filter unit 15 is the same or similar. As a result, when viewing the display device in the dark state, even if the viewing angles are different, attenuation degrees of light rays emitted from the color filter units 15 of different colors may be the same or similar, so that the white balance of the light rays reflected by the display device is not be disturbed under different viewing angles, and then obvious color separation phenomenon cannot be seen, thereby improving effectively user's experience. As a result, in the dark state, obvious color separation phenomenon cannot be seen, thereby improving effectively user's experience Further, contour profiles of orthographic projections of various combined reflection units to the base substrate 10 may be set to be the same or similar.

Specifically, when contour profiles of orthographic projections of various reflection units 17 to the base substrate 10 are the same or similar, each compensation unit 18 can adaptively compensate light intensity of outgoing light rays of the corresponding color filter unit 15 in the dark state, so that in the dark state, the light intensity of the light rays emitted from each color filter unit 15 is the same or similar.

In some embodiments, the display device provided in the above embodiment may include an independent color filter unit that is not corresponding to the compensation unit 18 and an independent light-emitting unit that is not corresponding to the reflection unit 17. An area of an orthographic projection of the independent color filter unit to the base substrate 10 is equal to an area of an orthographic projection of the combined filter unit to the base substrate 10. An area of an orthographic projection of the anode layer 13 in the independent light-emitting unit to the base substrate 10 is equal to an area of an orthographic projection of the combined reflection unit to the base substrate 10.

Specifically, the independent light-emitting unit included in the display device may be one light-emitting unit with the largest area in the display device. The corresponding independent color filter unit 15 is the color filter unit 15 that is corresponding to the light-emitting unit with the largest area. More specifically, for example, the display device includes a red light-emitting unit, a green light-emitting unit and a blue light-emitting unit, the area of the orthographic projection of the blue light-emitting unit to the base substrate 10 is greater than the area of the orthographic projection of the red light-emitting unit to the base substrate 10, and the area of the orthographic projection of the red light-emitting unit to the base substrate 10 is greater than the area of the orthographic projection of the green light-emitting unit to the base substrate 10. Therefore, the area of the orthographic projection of the blue filter unit 153 corresponding to the blue light-emitting unit to the base substrate 10 is greater than an area of an orthographic projection of the red filter unit 151 corresponding to the red light-emitting unit to the base substrate 10; the area of the orthographic projection of the red filter unit 151 correspond to the red light-emitting unit to the base substrate 10 is greater than an area of an orthographic projection of the green filter unit 152 corresponding to the green light-emitting unit to the base substrate 10. An area of an orthographic projection of the anode layer 13 in the blue light-emitting unit to the base substrate 10 is greater than an area of an orthographic projection of the anode layer 13 in the red light-emitting unit to the base substrate 10. The area of the orthographic projection of the anode layer 13 in the red light-emitting unit to the base substrate 10 is greater than an area of an orthographic projection of the anode layer 13 in the green light-emitting unit to the base substrate 10.

Therefore, when the compensation unit 18 and the reflection unit 17 are provided, the corresponding compensation unit 18 and the reflection unit 17 may be provided only for the red filter unit 151 and the green filter unit 152. That is, an area of an orthographic projection of the red combined filter unit to the base substrate 10 is equal to an area of an orthographic projection of the green combined filter unit to the base substrate 10; and the area of the orthographic projection of the red combined filter unit to the base substrate 10 is also equal to an area of an orthographic projection of the independent blue filter unit to the base substrate 10. Meanwhile, an area of an orthographic projection of the combined reflection unit corresponding to the red light-emitting unit to the base substrate 10 is equal to an area of an orthographic projection of the combined reflection unit corresponding to the green light-emitting unit to the base substrate 10; and the area of the orthographic projection of the combined reflection unit corresponding to the red light-emitting unit to the base substrate 10 is equal to an area of an orthographic projection of the anode layer 13 in the independent blue light-emitting unit to the base substrate 10.

Thus, when the compensation unit 18 and the reflection unit 17 are provided in the display device, it is not needed to provide the corresponding compensation unit 18 and the reflection unit 17 for all of the light-emitting units. In other words, the corresponding compensation unit 18 and the reflection unit 17 may be provided only for other light-emitting units except for the independent light-emitting unit with the largest orthographic projection area to the base substrate 10. An orthographic projection of the combined reflection unit corresponding to the other light-emitting unit to the base substrate 10 is equal to an area of an orthographic projection of the color filter unit 15 corresponding to the independent light-emitting unit to the base substrate 10. An orthographic projection of the reflection unit 17 corresponding to the other light-emitting unit to the base substrate 10 is equal to an area of an orthographic projection of the anode layer 13 in the independent blue light-emitting unit to the base substrate 10. In this way, when viewing the display device in the dark state, obvious color separation phenomenon cannot be seen, and the production cost of the display device is saved to the greatest extent.

Figure 5:
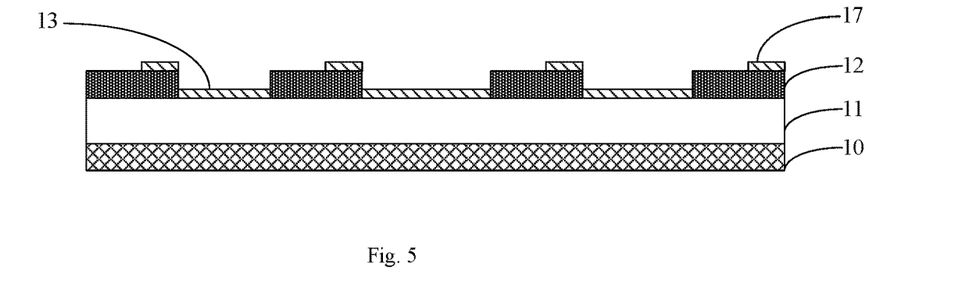
FIG. 5 is a schematic view showing fabrication of an anode layer and a reflector according to an embodiment of the present disclosure.

One embodiment of the present disclosure further provides a method for manufacturing the display device provided in the above embodiment. The method includes steps of fabricating a display substrate and fabricating a color filter structure. As shown in FIG. 5, the step of fabricating a display substrate include: providing a base substrate 10; and fabricating a plurality of light-emitting units and reflection units 17 on the base substrate 10.

Figure 7:
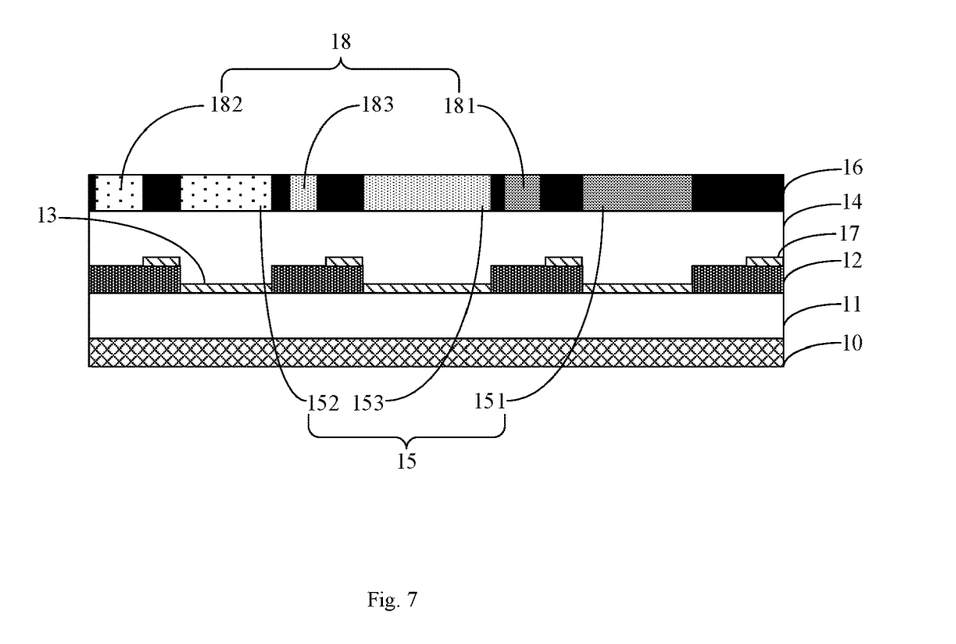
FIG. 7 is a schematic view showing fabrication of a color filter structure according to an embodiment of the present disclosure.

As shown in FIG. 7, the step of fabricating the color filter structure include: on one side of the plurality of light-emitting units distal to the base substrate 10, fabricating a light shading unit 16, a plurality of spaced color filter units 15 that are corresponding to the light-emitting units in a one-to-one manner, and a plurality of light transmission compensation units 18 that are corresponding to at least some of the color filter units 15 in a one-to-one manner. The reflection units 17 are corresponding to the compensation units 18 in a one-to-one manner. The reflection unit 17 is located at a periphery of the corresponding light-emitting unit. When the display device is in a dark state, the reflection unit 17 is configured to reflect ambient light rays that are incident from the corresponding compensation unit 18 to the corresponding color filter unit 15, thereby enabling the ambient light rays to emit out from the display device through the color filter unit 15 and then enabling brightness of the ambient light rays emitted from the plurality of color filter units 15 to be uniformly attenuated.

Specifically, when fabricating the display substrate, the specific types of the base substrate 10 may be selected according to actual needs. For example, the base substrate 10 may employ a glass substrate. When fabricating the light-emitting unit, a thin film transistor array layer 11 may be first fabricated on the base substrate 10, then an array of light-emitting units may be fabricated on the thin film transistor array layer 11, and then corresponding reflection units 17 may be fabricated around at least some of the light-emitting units. After formation of the display substrate, the color filter structure may be fabricated on one side of light-emitting units distal to the base substrate 10. The color filter structure includes a light shading unit 16, a plurality of spaced color filter units 15 and a plurality of light transmission compensation units 18. The compensation unit 18 may be disposed at a periphery of the corresponding color filter unit 15, and the compensation unit 18 is spaced apart from the corresponding color filter unit 15.

When the display device manufactured through the above method is in the display state, the thin film transistor array layer 11 drives a plurality of light-emitting units to emit light, and the light rays emitted from the plurality of light-emitting units pass through corresponding color filter units 15 and then emit out of the display device, thereby realizing the display function of the display device. When the display device is in dark state, ambient light rays may be incident from each color filter unit 15 into the display component, reflected by the anode layer 13 of each light-emitting unit corresponding to each color filter unit 15, and emitted out from the OLED display component through each color filter unit 15. Meanwhile, ambient light rays may be incident from the compensation units 18 into the display device, reflected by the reflection units 17 corresponding to the compensation units 18, and then emitted out from the OLED display component through each color filter unit 15 corresponding to the compensation units 18.

According to the method for manufacturing a display device in one embodiment of the present disclosure, the reflection units 17 are corresponding to the compensation units 18 in a one-to-one manner. The compensation units 18 are formed on the color filter structure and are corresponding to at least some of the color filter units 15 in a one-to-one manner. The reflection unit 17 is formed on the periphery of the corresponding light-emitting unit. When the display device is in dark state, ambient light rays may be incident into the display device from each color filter unit 15, then reflected by the anode layer 13 of each light-emitting unit corresponding to each color filter unit 15, and then emitted out from the display device through each color filter unit 15. Meanwhile, ambient light rays may also be incident from compensation units 18 into the display device, reflected by the reflection units 17 corresponding to the compensation units 18, and then emitted out from the display device through each color filter unit 15 corresponding to the compensation units 18. As a result, brightness of the ambient light rays that emit out from the display device through the color filter unit 15, may be uniformly attenuated. Therefore, when the display device manufactured through the method provided in one embodiment of the present disclosure is in the dark state, luminance attenuations of light rays emitted from the color filter units 15 of different colors when viewing from different viewing angles may be the same or similar. Thus, in the dark state, the white balance of the light rays reflected by the display device is not be disturbed under different viewing angles, and then obvious color separation phenomenon cannot be seen, thereby improving effectively user's experience.

In addition, according to the method for manufacturing a display device in one embodiment of the present disclosure, the compensation unit 18 is formed around the corresponding color filter unit 15 and the compensation unit 18 is spaced from the color filter unit 15, so that the light shading unit 16 is disposed between the compensation unit 18 and each color filter unit 15. In this way, when the produced display device realizes the display function, light rays emitted by each pixel unit can still emit out of the display device only through the corresponding color filter unit 15, and cannot emit out of the display device through the compensation unit 18. This ensures the normal display effect of the display device in the display state and prevents the normal display effect of the display device from being affected by the additional compensation unit 18.

Figure 6:
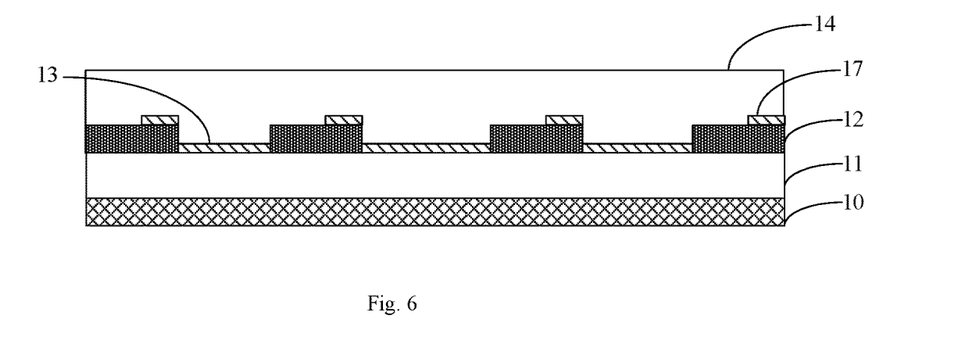
FIG. 6 is a schematic view showing fabrication of an encapsulation film according to an embodiment of the present disclosure.

Further, as shown in FIG. 6, the step of fabricating the display substrate may further include: before fabricating the light-emitting unit, fabricating a pixel definition layer 12 on the base substrate 10. The pixel definition layer 12 defines a plurality of pixel opening regions on the base substrate 10.

The step of fabricating a plurality of light-emitting units and reflection units 17 on the base substrate 10, includes: fabricating the reflection units 17 and the anode layers 13 of the light-emitting units though one film forming process in such a manner that the reflection units 17 are on a surface of the pixel definition layer 12 distal to the base substrate 10 and the anode layers 13 are disposed in the pixel opening regions in a one-to-one manner; fabricating light-emitting layers of the light-emitting units on one side of the anode layers 13 distal to the base substrate 10; and fabricating cathode layers of the light-emitting units on one side of the light-emitting layers distal to the base substrate 10.

Specifically, after the thin film transistor array layer 11 is fabricated on the base substrate 10, the pixel definition layer 12 is fabricated on one side of the thin film transistor array layer 11 distal to the base substrate 10. The pixel definition layer 12 defines a plurality of pixel opening regions for light-emitting units. The pixel definition layer 12 may be made of resin material. One fabrication process for the pixel definition layer 12 includes conventional processes such as exposing and developing, which will not be elaborated herein.

After formation of the pixel definition layer 12, the reflection unit 17 and the anode layer 13 of the light-emitting unit can be simultaneously fabricated by one film forming process. The specific fabrication method may include: forming a metal film with metal Al, which covers the pixel definition layer 12 and the pixel opening regions defined by the pixel definition layer 12; patterning the metal film by adopting conventional process (including exposing, developing and etching, etc.), thereby forming the reflection unit 17 on one surface of the pixel definition layer 12 distal to the base substrate 10 as well as the anode layers 13 in the pixel opening regions. It should be noted that the thickness of the reflection unit 17 and the anode layer 13 in a direction perpendicular to the base substrate 10 may be set between 1000 Å-2000 Å.

After formation of the anode layers 13 of the light-emitting units, light-emitting layers of the light-emitting units can be fabricated on one side of the anode layers 13 distal to the base substrate 10; and cathode layers of the light-emitting units can be fabricated on one side of the light-emitting layers distal to the anode layers 13.

Since the fabricated pixel definition layer 12 mainly includes a barrier-wall pattern, that is, the pixel opening regions are defined by the barrier-wall pattern. Since a surface of the barrier pattern distal to the base substrate 10 is a flat surface and the barrier-wall pattern is disposed around a periphery of the light-emitting units, by arranging the reflection units 17 on one the surface of the pixel definition layer 12 distal to the base substrate 10, it not only ensures normal reflection function of the reflection units 17, but also does not affect the normal display of the display device. In addition, the reflection units 17 and the anode layers 13 can be simultaneously fabricated through one-time film forming process, which avoids adding additional film forming process for fabricating the reflection units 17 and saves the production cost of the display device.

In some embodiments, the above step of fabricating the corresponding compensation unit 18 and the color filter unit 15 in the color filter structure may include: fabricating the corresponding compensation unit 18 and the color filter unit 15 through one-time film forming process.

Specifically, as an example, one process for fabricating the green filter unit 152 and the compensation unit 18 corresponding to the green filter unit 152 includes: forming a green film layer on a base by using green filter material; exposing the green film layer with a mask plate, thereby forming a film reserved region and a film removal region, where the film reserved region is corresponding to regions in which the green filter unit 152 and the compensation unit 18 are located, and the film removal region is corresponding to other regions except for the regions in which the green filter unit 152 and the compensation unit 18 are located; then, developing the exposed green film layer with a developer to remove the green film layer in the film removal region, thereby forming the green filter unit 152 and the corresponding compensation unit 18.

Since the compensation unit 18 and the color filter unit 15 are fabricated through one-time film forming process, which avoids adding additional film forming process for fabricating the compensation unit 18 and saves the production cost of the display device.

As shown in FIG. 6, in some embodiments, the method provided by the above embodiment further includes: encapsulating the display substrate with a thin film after fabrication of the display substrate and before fabrication of the color filter structure.

Specifically, after the fabrication of the display substrate, the display substrate may be encapsulated with a thin film. There are many ways to realize the thin film encapsulation. For example, chemical vapor deposition (CVD) method can be used to realize the thin film encapsulation.

After the fabrication of the display substrate, the display substrate is encapsulated with a thin film, thereby forming an encapsulation film 14. The encapsulation film 14 can isolate the display substrate from the environment, thereby preventing water and oxygen from entering into the light-emitting layer of the light-emitting unit of the display substrate and then ensuring the service life of the display substrate. Meanwhile, an outer surface of the encapsulated display substrate is a flat surface, so that the color filter structure can be fabricated on the flat surface and this is conducive to improve the display effect of the display substrate.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A display device comprising:
   a display substrate comprising:
      a base substrate;
      a plurality of light-emitting units on the base substrate;
      a pixel definition layer on the base substrate, the pixel definition layer defining a plurality of pixel opening regions on the base substrate, the plurality of light-emitting units being disposed in the plurality of pixel opening regions in a one-to-one manner; and
      a reflection unit on a surface of the pixel definition layer distal to the base substrate; and
   a color filter structure comprising:
      a shading unit;
      a plurality of spaced color filter units in the shading unit, the color filter units corresponding to the light-emitting units in a one-to-one manner; and
      a plurality of light transmission compensation units corresponding to at least some of the color filter units in a one-to-one manner, the compensation units are in the shading unit and are located at a periphery of the corresponding color filter unit, the compensation units being spaced from the corresponding color filter unit,
   wherein the a reflection unit is located at a periphery of a corresponding light-emitting unit, and
   wherein an orthographic projection of the compensation units to the base substrate is within an orthographic projection of the pixel definition layer to the base substrate.

2. The display device of claim 1, wherein the compensation unit is located at a periphery of the corresponding color filter unit; and the compensation unit is spaced from the corresponding color filter unit.

3. The display device of claim 1, wherein an orthographic projection of the reflection unit to the base substrate is located between an orthographic projection of the corresponding compensation unit to the base substrate and an orthographic projection of the corresponding color filter unit to the base substrate.

4. The display device of claim 3, wherein there is no overlapping between the orthographic projection of the reflection unit to the base substrate and the orthographic projection of the corresponding compensation unit to the base substrate.

5. The display device of claim 1, wherein the color filter unit and the corresponding compensation unit form as a combined filter unit; and an area of an orthographic projection of each combined filter unit to the base substrate is approximately the same.

6. The display device of claim 5, wherein the color filter units include a red filter unit, a green filter unit and a blue filter unit; an area of the red filter unit is greater than an area of the green filter unit, and the area of the red filter unit is less than an area of the blue filter unit;
   the compensation units include a red compensation unit, a green compensation unit and a blue compensation unit; and an area of the red compensation unit is greater than an area of the blue compensation unit, and the area of the red compensation unit is less than an area of the green compensation unit.

7. The display device of claim 6, wherein the red compensation unit includes a plurality of independent red compensation sub-units; the plurality of independent red compensation sub-units are distributed around a periphery of the red filter unit;
   the green compensation unit includes a plurality of independent green compensation sub-units; the plurality of independent green compensation sub-units are distributed around a periphery of the green filter unit; and
   the blue compensation unit includes a plurality of independent blue compensation sub-units; the plurality of independent blue compensation sub-units are distributed around a periphery of the blue filter unit.

8. The display device of claim 7, wherein a quantity of the red compensation sub-units distributed around the periphery of the identical red filter unit, is greater than a quantity of the blue compensation sub-units distributed around the periphery of the identical blue filter unit; and the quantity of the red compensation sub-units distributed around the periphery of the identical red filter unit, is less than a quantity of the green compensation sub-units distributed around the periphery of the identical green filter unit.

9. The display device of claim 5, wherein the light-emitting unit includes a cathode layer, a reflective anode layer disposed opposite to the cathode layer, and a light-emitting layer disposed between the anode layer and the cathode layer; the anode layer is disposed between the cathode layer and the base substrate; and the reflection unit and the anode layer in the corresponding light-emitting unit together form a combined reflection unit; an area of an orthographic projection of each combined reflection unit to the base substrate is approximately the same.

10. The display device of claim 1, wherein the compensation unit and the corresponding color filter unit are in the same layer and made of the same material.

11. The display device of claim 1, wherein each compensation unit includes a plurality of independent compensation sub-units; the plurality of independent compensation sub-units are distributed around a periphery of the corresponding color filter unit.

\* \* \* \* \*